United States Patent [19]

Nakagiri et al.

[11] Patent Number: 5,448,891

[45] Date of Patent: Sep. 12, 1995

[54] DEHUMIDIFIER

[75] Inventors: Yasushi Nakagiri, Osaka; Yoshiaki Yamamoto, Katano; Hisaaki Gyoten, Shijonawate; Shoko Nakasuji, Osaka, all of Japan

[73] Assignee: Matsushita Electric Industrial Co., Ltd., Kadoma, Japan

[21] Appl. No.: 201,262

[22] Filed: Feb. 24, 1994

[30] Foreign Application Priority Data

Mar. 10, 1993 [JP] Japan ................... 5-048840

[51] Int. Cl.$^6$ ............................................. F25B 21/02
[52] U.S. Cl. ........................................ 62/3.4; 62/3.1; 62/3.7
[58] Field of Search ............... 62/3.1, 3.2, 3.4, 3.7

[56] References Cited

U.S. PATENT DOCUMENTS

| 3,024,616 | 3/1962 | Bury | 62/3 |
|---|---|---|---|
| 3,126,710 | 3/1964 | Boehmer | 62/3.4 |
| 3,266,258 | 8/1966 | Rosenfeld et al. | 62/3.2 |
| 3,272,659 | 9/1966 | Bassett et al. | 62/3.2 |
| 3,547,705 | 12/1970 | Heard | 62/3.2 |
| 3,879,229 | 4/1975 | Gilbert | 136/208 |
| 4,807,441 | 2/1989 | Agee et al. | 62/3 |
| 4,838,911 | 6/1989 | Robertson et al. | 62/3.3 |
| 5,074,116 | 12/1991 | Kadotani et al. | 62/3.2 |
| 5,119,640 | 6/1992 | Conrad | 62/272 |
| 5,201,182 | 4/1993 | Grignon et al. | 62/3.2 |

FOREIGN PATENT DOCUMENTS

| 4227148 | 12/1992 | Germany . |
|---|---|---|
| 6041525 | 3/1985 | Japan . |
| 6231223 | 2/1987 | Japan . |
| 3275113 | 12/1991 | Japan . |
| 4058572 | 2/1992 | Japan . |
| 523527 | 2/1993 | Japan . |
| 557126 | 3/1993 | Japan . |
| 819646 | 9/1959 | United Kingdom . |

OTHER PUBLICATIONS

Search Report for European Appl. 94103513.1, Mailed Jul. 5, 1994.

Delves, "The Prospects for Ettinghausen and Peltier Cooling at Low Temperatures", Brit. J. Appl. Phys., 1962, vol. 13, pp. 440–445.

*Primary Examiner*—Henry A. Bennet
*Assistant Examiner*—William C. Doerrler
*Attorney, Agent, or Firm*—Renner, Otto, Boisselle & Sklar

[57] ABSTRACT

A dehumidifier of the present invention includes: a first frame; a second frame formed inside of the first frame, having a first opening and a second opening; and a unit for allowing air to flow from the first opening to the second opening, wherein the second frame has a hollow substrate, a thermoelectric element formed on a surface of the hollow substrate directly, a pair of electrodes, connected to the thermoelectric element, for supplying an electric current to the thermoelectric element, and the thermoelectric element causes a temperature difference between the outer surface and the inner surface of the second frame.

14 Claims, 2 Drawing Sheets

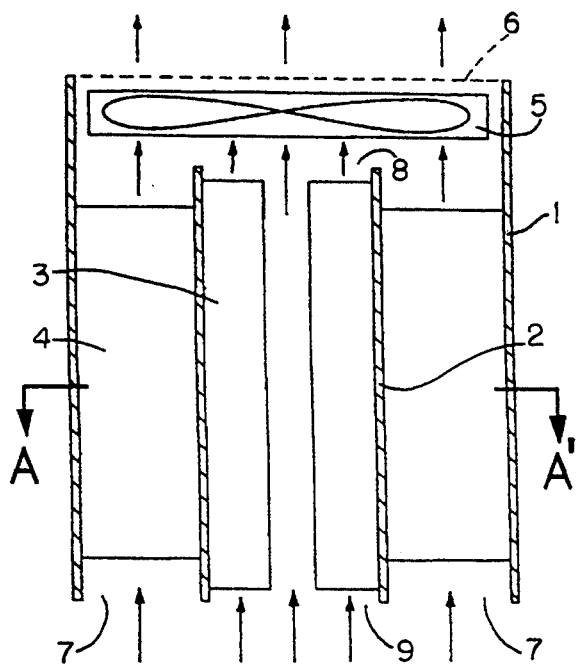
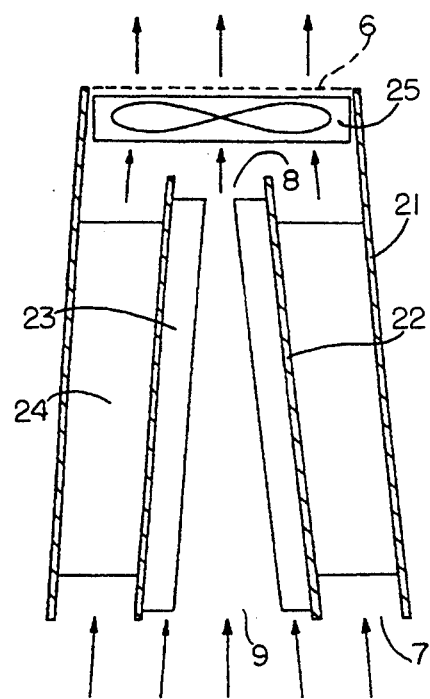
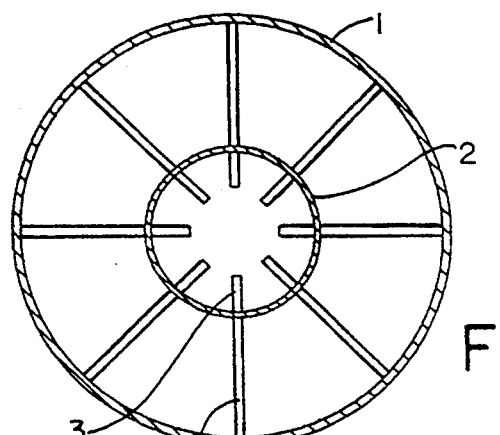
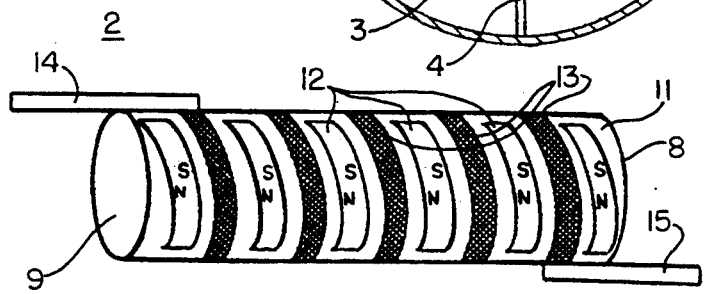
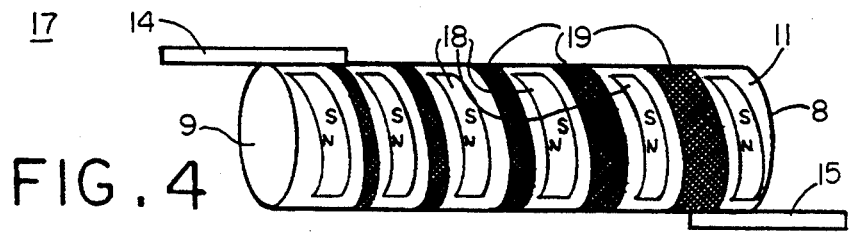

DEHUMIDIFIER

BACKGROUND OF THE INVENTION

1. Field of the Invention

The present invention relates to a dehumidifier, and more particularly to a dehumidifier electrically dehumidifying the air using a thermoelectric element.

2. Description of the Related Art

In conventional dehumidifiers equipped with a freezing cycle unit including a compressor, a condenser, a decompressor, an evaporator, and the like, humid air is cooled below the dew point by a heat exchanger to be dehumidified. Such conventional dehumidifiers have the following problems:

Each component of the freezing cycle unit of such a conventional dehumidifier is large in size and heavy in weight; in addition, pipelines are required for connecting the respective components. This makes it difficult to obtain a small-sized and light-weight dehumidifier. The conventional dehumidifier causes a large noise because of its driving portion such as a compressor, an air blower, and the like. Furthermore, when the evaporator is frosted, defrosting is required. As dehumidification is interrupted while defrosting, operating efficiency of the dehumidifier is decreased.

SUMMARY OF THE INVENTION

The dehumidifier of this invention comprises: a first frame; a second frame formed inside of the first frame, having a first opening and a second opening; and means for allowing air to flow from the first opening to the second opening, wherein the second frame has a hollow substrate, a thermoelectric element formed on a surface of the hollow substrate directly, a pair of electrodes, connected to the thermoelectric element, for supplying an electric current to the thermoelectric element and the thermoelectric element causes a temperature difference between an outer surface and an inner surface of the second frame.

In one embodiment of the present invention, the thermoelectric element is made of an Ettingshausen element, and the second frame has a plurality of magnetic thin films provided on the surface of the hollow substrate so that magnetic lines of force are formed in a direction substantially orthogonal to a direction of an electric current flowing through the Ettingshausen element.

In another embodiment of the present invention, the Ettingshausen element is a ribbon-shaped Ettingshausen element, spirally provided on the surface of the hollow substrate and each of the magnetic thin films is disposed on the surface of the hollow substrate between adjacent Ettingshausen element.

In another embodiment of the present invention, the width of the Ettingshausen element becomes progressively larger in a direction from the first opening to the second opening.

In another embodiment of the present invention, the second frame is a cylindrical frame and the inner diameter of the second frame becomes progressively smaller in a direction from the first opening to the second opening.

In another embodiment of the present invention, a fin for cooling air is provided inside the second frame.

In another embodiment of the present invention, a fin for releasing heat generated in the second frame is provided between the first frame and the second frame.

Because of the above-mentioned features, the dehumidifier of the present invention dehumidifies air by causing a temperature difference between the outer surface and the inner surface of the second frame, using the thermoelectric element. Thus, a small-sized and light-weight dehumidifier requiring no compressor, condenser, decompressor, evaporator, and the like can be provided.

The dehumidifier of the present invention requires no driving portion such as a compressor and requires only one instrument for allowing the air to flow into the dehumidifier. Therefore, a small-sized dehumidifier producing less noise during the operation can be provided.

Moreover, the dehumidifier of the present invention dehumidifies the air using the Ettingshausen element. Therefore, defrosting can be easily performed by allowing the electric current flowing through the Ettingshausen element to flow in the direction opposite to that during dehumidifying. Accordingly, the dehumidifier of the present invention can easily be defrosted within a short period of time, resulting in satisfactory operating efficiency.

Furthermore, the Ettingshausen element in a ribbon shape used in the dehumidifier of the present invention is spirally provided on the surface of the hollow substrate. Therefore, the small-sized dehumidifier with satisfactory efficiency can be provided.

Since the width of the Ettingshausen element becomes progressively larger toward the direction of the air flow, a dehumidifier which can efficiently dehumidify the air with a small electric power can be provided.

Since the inner diameter of the second cylinder-shaped frame of the dehumidifier becomes progressively smaller toward the direction of the air flow, a dehumidifier which can efficiently dehumidify the air with a small electric power can be provided.

Thus, the invention described herein makes possible the advantages of (1) providing a small-sized and light weight dehumidifier; (2) providing a dehumidifier which hardly causes a noise even during the operation; and (3) providing a dehumidifier with satisfactory operating efficiency in which defrosting can be easily performed within a short period of time.

These and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view of a dehumidifier of the first example according to the present invention.

FIG. 2 is a cross-sectional view of the dehumidifier of the first example according to the present invention, taken along a line A-A' of FIG. 1.

FIG. 3 is a perspective view of an internal cylinder-shaped frame of the first example according to the present invention.

FIG. 4 is a perspective view of an internal cylinder-shaped frame of the second example according to the present invention.

FIG. 5 is a cross-sectional view of a dehumidifier of the third example according to the present invention.

DESCRIPTION OF THE PREFERRED EMBODIMENTS

Figure 6:
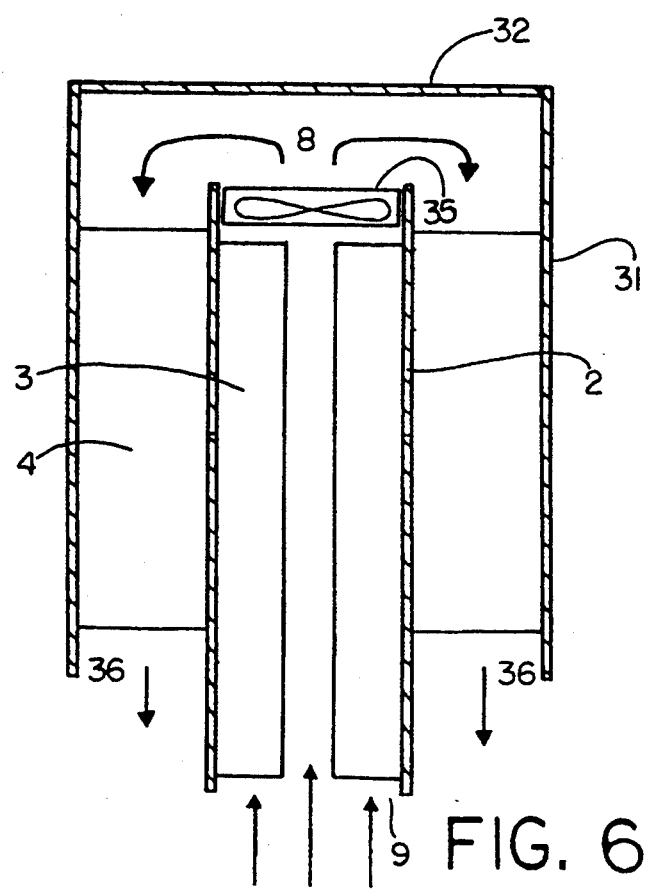
FIG. 6 is a cross-sectional view of a dehumidifier of the fourth example according to the present invention.

Hereinafter, the present invention will be described by way of illustrative examples with reference to the drawings. Throughout the following examples, identical components bear identical reference numerals.

EXAMPLE 1

FIG. 1 is a cross-sectional view of a dehumidifier of the first example. As shown in this figure, the dehumidifier includes an external cylindrical frame 1 and an internal cylindrical frame 2 provided inside of the external cylindrical frame 1. The external cylindrical frame i includes an inlet 7 and an outlet 6; the internal cylindrical frame 2 includes an internal inlet 9 and an internal outlet 8. The external cylindrical frame 1 and the internal cylindrical frame 2 form a coaxial cylinder structure.

The dehumidifier further includes a fan 5 for allowing air to flow in the direction (indicated by arrows) from the inlet 7 and the internal inlet 9 to the outlet 6 and the internal outlet 8. The fan 5 is provided in the vicinity of the outlet 6 and inside of the external cylindrical frame 1. The fan 5 allows air to flow in the following way: Air flows into an inside of the dehumidifier from the inlet 7 and the internal inlet 9, and then passes through the inside of the dehumidifier and is discharged from the outlet 6 and the internal outlet 8.

A plurality of plate-shaped cooling fins 3 for cooling air are provided inside of the internal cylindrical frame 2. A plurality of plate-shaped radiation fins 4 for dissipating heat (releasing heat generated in the internal cylindrical frame 2) are provided between the internal cylindrical frame 2 and the external cylindrical frame 1. The cooling fins 3 are fixed to the internal cylindrical frame 2 and to the external cylindrical frame 1.

FIG. 2 is a cross-sectional view of the dehumidifier of the present example, taken along a line A–A' of FIG. 1. As shown in this figure, the cooling fins 3 and the radiation fins 4 are provided in a radial manner around a center axis of the external cylindrical frame 1 and the internal cylindrical frame 2.

FIG. 3 is a perspective view of the internal cylindrical frame 2 of the present example. As shown in this figure, the internal cylindrical frame 2 includes a substrate 11 in a cylinder shape having an electrical insulating property, a plurality of magnetized Fe(iron) thin films 12, and a $Bi_{88}Sb_{12}$ thin film 13 which is an Ettingshausen element. A plurality of magnetized Fe thin films 12 and a $Bi_{88}Sb_{12}$ thin film 13 are directly formed on the outer surface of the substrate 11. The $Bi_{88}Sb_{12}$ thin film 13 has a ribbon shape and is provided in a spiral shape from one end of the substrate 11 to the other end thereof. Each of the plurality of Fe thin films 12 is disposed between adjacent $Bi_{88}Sb_{12}$ thin film 13. That is, when seen from the side of the internal cylindrical frame 2 on which the plurality of Fe thin films 12 are provided, the plurality of Fe thin films 12 and the sections of the $Bi_{88}Sb_{12}$ thin film 13 are alternately positioned along the direction of the axis of the internal cylindrical frame 2. On the side of the internal cylindrical frame 2 opposite to that shown in FIG. 3, the plurality of Fe thin films 12 and the $Bi_{88}Sb_{12}$ thin film 13 are positioned in the same way. In the present example, the $Bi_{88}Sb_{12}$ thin film 13 has a uniform width everywhere on the substrate 11. On both ends of the $Bi_{88}Sb_{12}$ thin film 13, electrodes 14 and 15 made of metal are provided so as not to come into contact with the Fe thin film 12. The electrodes 14 and 15 supply an electric current to the $Bi_{88}Sb_{12}$ thin film 13. The plurality of magnetized Fe thin films 12 on the substrate 11 are provided so as to form a magnetic field wherein the magnetic lines of force are formed in the direction substantially orthogonal to the direction of an electric current flowing through the $Bi_{88}Sb_{12}$ thin film 13. More specifically, the plurality of Fe thin films 12 are positioned so that a S-pole of one Fe thin film faces a N-pole of the adjacent Fe thin film with a section of the $Bi_{88}Sb_{12}$ thin film 13 sandwiched therebetween. It is preferred that a material having high electrical insulating property and high heat conductivity is used for the substrate 11. In addition, it is preferred that a material having high heat conductivity is used for the external cylindrical frame 1.

Hereinafter, the operation of the dehumidifier of the first example will be described.

When a D.C. current is allowed to flow between the electrodes 14 and 15 by a power supply (not shown), a temperature difference is caused on the front and rear surfaces of the $Bi_{88}Sb_{12}$ thin film 13 because of the Ettingshausen effect. At this time, an electric current flows in the same direction and in the direction substantially orthogonal to that of the magnetic lines of force formed by the Fe thin films 12. Therefore, the rear (inner) surface of any part of the $Bi_{88}Sb_{12}$ thin film 13 has a low temperature and the front (outer) surface thereof has a high temperature. This results in that the inner surface of the internal cylindrical frame 2 and the cooling fins 3 are cooled to a low temperature, and the outer surface of the internal cylindrical frame 2 and the radiation fins 4 are heated to a high temperature.

The fan 5 is rotated to allow humid air to flow in the direction indicated by the arrows in FIG. 1. Because of this rotation, the humid air flows into the inside of the external cylindrical frame 1 through the internal inlet 9 and the inlet 7. The humid air flowing into the inside of the internal cylindrical frame 2 is cooled by the cooling fins 3 and the inner surface of the internal cylindrical frame 2 at a low temperature. When the temperature of the humid air reaches the dew point or less, the moisture contained in the humid air condenses into water. The water drops along the cooling fins 3 and the inner surface of the internal cylindrical frame 2. In this way, the moisture is removed from the air passing through the inside of the internal cylindrical frame 2, whereby the air is dehumidified. The air which has been dehumidified and dried passes through the fan 5 to flow out of the dehumidifier. On the other hand, the air passing through the outside of the internal cylindrical frame 2 is heated by the radiation fins 4 and the outer surface of the internal cylindrical frame 2 (i.e., heat exchange is effected); thus, radiation of heat from the radiation fins 4 and the outer surface of the internal cylindrical frame 2 is promoted.

In the case where the temperature of the inside of the internal cylindrical frame 2 decreases to an excess degree and the inside of the internal cylindrical frame 2 is frosted, an electric current is allowed to flow through the $Bi_{88}Sb_{12}$ thin film 13 in the direction opposite to that during dehumidification to raise the temperature of the inside of the internal cylindrical frame 2; thus, defrosting can be easily performed.

According to the present example, the following effects can be obtained:

(1) Since the driving portion such as a compressor is not required, a small-sized dehumidifier causing a small noise can be provided.

(2) Since the dehumidifier is not composed of a number of components such as a compressor, a condenser, a decompressor, an evaporator, and the like, a plurality of fans for allowing air to flow in and out are not required. Thus, a small-sized dehumidifier producing less noise can be provided.

(3) Since the Ettingshausen element can be formed directly in contact with the substrate, heat mobility between the Ettingshausen element and the substrate is high and efficient dehumidification can be performed.

(4) A plurality of internal cylindrical frames having different diameters can be provided so as to form concentric circles. In this case, the dehumidification effect of the dehumidifier can be further increased.

EXAMPLE 2

FIG. 4 is a perspective view of an internal cylindrical frame 17 of the second example. The dehumidifier shown in this figure has the same structure as that of the first example, except that the internal cylindrical frame 2 is replaced by an internal cylindrical frame 17.

As shown in FIG. 4, the internal cylindrical frame 17 includes the substrate 11 in a cylinder shape having an electrical insulating property, a plurality of magnetized Fe thin films 18 provided on the outer surface of the substrate 11, and a $Bi_{88}Sb_{12}$ thin film 19 which is an Ettingshausen element. The $Bi_{88}Sb_{12}$ thin film 19 has a ribbon shape and is provided in a spiral shape from one end of the substrate 11 to the other end thereof. Each of the plurality of Fe thin films 18 is disposed between adjacent $Bi_{88}Sb_{12}$ thin film 19. That is, when seen from the side of the internal cylindrical frame 17 on which the plurality of Fe thin films 18 are provided, the plurality of Fe thin films 18 and the sections of the $Bi_{88}Sb_{12}$ thin film 19 are alternately positioned along the direction of the axis of the internal cylindrical frame 17. On the side of the internal cylindrical frame 17 opposite to that shown in FIG. 4, the plurality of Fe thin films 18 and the $Bi_{88}Sb_{12}$ thin film 19 are positioned in the same way. In the present example, the width of the $Bi_{88}Sb_{12}$ thin film 19 becomes progressively larger in a direction from the internal inlet 9 to the internal outlet 8. On both ends of the $Bi_{88}Sb_{12}$ thin film 19, electrodes 14 and 15 made of metal are provided so as not to come into contact with the Fe thin film 18. The electrodes 14 and 15 supply an electric current to the $Bi_{88}Sb_{12}$ thin film 19. The plurality of magnetized Fe thin films 18 on the substrate 11 are provided so as to form a magnetic field wherein the magnetic lines of force are formed in the direction substantially orthogonal to the direction of an electric current flowing through the $Bi_{88}Sb_{12}$ thin film 19. More specifically, the plurality of Fe thin films 18 are positioned so that a S-pole of one Fe thin film faces a N-pole of adjacent Fe thin film with a section of the $Bi_{88}Sb_{12}$ thin film 19 sandwiched therebetween.

Hereinafter, the operation of the dehumidifier of the second example will be described.

When a D.C. current flows between the electrodes 14 and 15 by a power supply (not shown), a temperature difference is caused on the front and rear surfaces of the $Bi_{88}Sb_{12}$ thin film 19 because of the Ettingshausen effect. At this time, since an electric current flows in the same direction and in the direction substantially orthogonal to the magnetic lines of force formed by the Fe thin films 18, the rear (inner) surface of any part of the $Bi_{88}Sb_{12}$ thin film 19 has a low temperature and the front (outer) surface thereof has a high temperature. This results in that the inner surface of the internal cylindrical frame 17 and the cooling fins 3 are cooled to a low temperature, and the outer surface of the internal cylindrical frame 17 and the radiation fins 4 are heated to a high temperature.

The fan 5 is rotated to allow humid air to flow in the direction indicated by the arrows in FIG. 1. Because of this rotation, the humid air flows into the inside of the external cylindrical frame 1 through the internal inlet 9 and the inlet 7. The humid air flowing into the inside of the internal cylindrical frame 17 is cooled by the cooling fins 3 and the inner surface of the internal cylindrical frame 17 at a low temperature. When the temperature of the humid air reaches the dew point or less, the moisture contained in the humid air condenses into water. The water drops along the cooling fins 3 and the inside of the internal cylindrical frame 17. In this way, the moisture is removed from the air passing through the inner surface of the internal cylindrical frame 17, whereby the air is dehumidified. The air which has been dehumidified and dried passes through the fan 5 to flow out of the dehumidifier. On the other hand, the air passing through the outside of the internal cylindrical frame 17 is heated by the radiation fins 4 and the outer surface of the internal cylindrical frame 17 (heat exchange is effected), and radiation of heat from the radiation fins 4 and the outer surface of the internal cylindrical frame 17 is promoted.

Since the width of the $Bi_{88}Sb_{12}$ thin film 19 is set so as to become larger in a direction from the internal inlet 9 to the internal outlet 8, the heat absorbing effects of each section of the $Bi_{88}Sb_{12}$ thin film 19 will be different. The internal cylindrical frame 17 can be designed in the following manner: In the case where air flows through the inside of the internal cylindrical frame 17, the temperature of the inside surface of the internal cylindrical frame 17 gets lower from the internal inlet 9 to the internal outlet 8 while the temperature difference on the front and rear surfaces of the internal cylindrical frame 17 is kept at a constant level. When the internal cylindrical frame 17 thus designed is used for the dehumidifier shown in FIG. 1, the air flowing inside of the internal cylindrical frame 17 comes into contact with the cooling fins 3 and the internal cylindrical frame 17 whose temperature becomes lower in the direction from the upstream side of the air flowing to the downstream side thereof, because the width of the $Bi_{88}Sb_{12}$ thin film 19 becomes larger in the direction from the internal inlet 9 to the internal outlet 8. Therefore, as the air flows in the internal cylindrical frame 17, the air is more vigorously cooled. In this way, the humid air flowing inside of the internal cylindrical frame 17 is further cooled toward the internal outlet 8. Because of this, even though the average temperature difference between the front surface of the $Bi_{88}Sb_{12}$ thin film 19 and the rear surface thereof is made small, the same cooling effects as those, in the case where the width of the $Bi_{88}Sb_{12}$ thin film 19 is set to be constant, can be obtained with a small electric power. Accordingly, the same dehumidifying effects as those in the case where the width of the $Bi_{88}Sb_{12}$ thin film 19 is set to be constant can be obtained with a small electric power.

In the case where the temperature of the inside of the internal cylindrical frame 17 decreases to an excess degree and the inside of the internal cylindrical frame 17 is frosted, an electric current is made to flow through the $Bi_{88}Sb_{12}$ thin film 19 in the direction opposite to that during dehumidification to raise the temperature of the inside of the internal cylindrical frame 17; thus, defrosting can be easily performed.

According to the second example, the following effects can be obtained in addition to the effects obtained in the first example.

The air is further cooled as it flows inside of the internal cylindrical frame 17; thus, the electric current flowing through a thermoelement can be efficiently used for dehumidifying the air. Consequently, a dehumidifier which efficiently performs dehumidification with a small electric power can be provided.

EXAMPLE 3

FIG. 5 is a cross-sectional view of a dehumidifier of the third example.

The third example is different from the first example in the following points: The inner diameter of an external cylindrical frame 21 becomes progressively smaller in a direction from the inlet 7 to the outlet 6 and the inner diameter of an internal cylindrical frame 22 becomes smaller in a direction from the internal inlet 9 to the internal outlet 8. The other structure is the same as that of the first example; that is, cooling fins 23 are provided inside of the internal cylindrical frame 22 and radiation fins 24 are provided between the internal cylindrical frame 22 and the external cylindrical frame 21. The cooling fins 23 are fixed to the internal cylindrical frame 22 and to the external cylindrical frame 21. A fan 25 for allowing the air to flow from the inlet 7 and the internal inlet 9 to the outlet 6 and the internal outlet 8 (in a direction indicated by arrows in FIG. 5) is provided in the vicinity of the outlet 6 and inside of the external cylindrical frame 21. The internal cylindrical frame 22 of the third example has the same structure as that of the internal cylindrical frame 2 of the first example shown in FIG. 3.

Hereinafter, the operation of the third example will be described.

An electric current is supplied to the $Bi_{88}Sb_{12}$ thin film 19 of the internal cylindrical frame 22, so that the inside of the internal cylindrical frame 22 is cooled. When the fan 25 is rotated under this condition, humid air flows into the inside of the internal cylindrical frame 22 through the internal inlet 9. Since the inner diameter of the internal cylindrical frame 22 of the third example becomes progressively smaller in a direction from the upstream side of the air flow to the downstream side thereof, as shown in FIG. 5, the cooling effect of the internal cylindrical frame 22 increases as it comes close to the internal outlet 8. Therefore, the air is further cooled as it flows inside of the internal cylindrical frame. In this way, the air can be more efficiently cooled, compared with the case where the inner diameter of the internal cylindrical frame 22 is constant. Consequently, the same dehumidifying effects as those, in the case where the inner diameter of the internal cylindrical frame 22 is constant, can be obtained with less electric power.

The inner diameter of the external cylindrical frame 21 becomes progressively smaller in a direction from the inlet 7 to the outlet 6, corresponding to the change in the inner diameter of the internal cylindrical frame 22. Thus, the air can be smoothly flown between the external cylindrical frame 21 and the internal cylindrical frame 22.

According the third example, the following effects in addition to those of the first example can be obtained.

Since the air is further cooled as it flows inside of the internal cylindrical frame 22, the electric current flowing through a thermoelement can be efficiently used for dehumidifying the air. Consequently, a dehumidifier which efficiently performs dehumidification with a small electric power can be provided.

The $Bi_{88}Sb_{12}$ thin film 19 of the third example can be designed so that the width thereof becomes progressively larger in a direction from the internal inlet 9 to the internal outlet 8, as is shown in the second example.

EXAMPLE 4

FIG. 6 is a cross-sectional view of a dehumidifier of the fourth example.

The present example is different from the first example in the points described below. The other structure is the same as that of the first example. In the fourth example, a fan 35 is provided in the vicinity of the internal outlet 8 inside of the internal cylindrical frame 2. The end of the external cylindrical frame 31 in the vicinity of the fan 35 is closed with a side wall 32, and the portion between the other end of the external cylindrical frame 31 and the internal cylindrical frame 2 is an outlet 36. The internal cylindrical frame 2 extends so as to project from the outlet 36, and the internal inlet 9 is placed outside the external cylindrical frame 31. When the fan 35 is rotated, the air flows inside of the internal cylindrical frame 2 through the internal inlet 9 from the outside of the dehumidifier. Then, the air is discharged from the internal outlet 8 and through the portion between the internal cylindrical frame 2 and the external cylindrical frame 31, the air is discharged from the outlet 36.

According to the fourth example, the following effects in addition to those of the first example can be obtained.

(1) Since the air cooled by the cooling fins 3 flows through the portion between the radiation fins 4, the radiation of heat from the radiation fins 4 can be quickened. Consequently, the dehumidification can be performed efficiently.

(2) Since the inlet and outlet for the air to be dehumidified are positioned in the same direction, the dehumidifier can be attached on a wall surface. Thus, the space required for installing the dehumidifier can be reduced. Consequently, a dehumidifier installable in a small place can be provided.

The internal cylindrical frame 17 of the second example or the internal cylindrical frame 22 of the third example can be used as the internal cylindrical frame 2 of the fourth example. In this case, the effects of the second example or the third example can be respectively obtained.

In the above-mentioned examples, the width and film thickness of the $Bi_{88}Sb_{12}$ thin film are determined so that the heat exchange with the air can be most efficiently effected on the basis of the following expression 1:

$$Qc = R_N \cdot Tc \cdot I - 0.5 \cdot \rho \cdot (L1/A1) \cdot I^2 - \lambda \cdot (A2/L2) \cdot (Th - Tc) \qquad (1)$$

(Qc: Absorbed amount of heat on a low temperature side, $R_N$: Nernst's coefficient, Tc: Temperature on a low temperature side, Th: Temperature on a high temperature side, I: Value of an electric current, $\rho$: Electrical resistivity, $\lambda$: Heat conductivity, L1 and A1: Distance and cross-section in an electric current direction, L2 and A2: Distance and cross-section in a temperature difference direction)

It is preferred that a material having a high electrical insulating property and high heat conductivity is used for the substrate of the internal cylindrical frame of Examples 1 through 4. More preferably, a material which has anisotropy of heat conduction is used for the substrate of the internal cylindrical frame of Examples 1 through 4 so that the heat conductivity is high in the direction orthogonal to the axis of the internal cylindrical frame and heat conductivity is low in the direction parallel with the axis of the internal cylindrical frame. Furthermore, it is preferred that a material having high heat conductivity is used for the external cylindrical frame 1.

In the above-mentioned examples, $Bi_{88}Sb_{12}$ is used as an Ettingshausen element; however, the Ettingshausen element used in the present invention is not limited to $Bi_{88}Sb_{12}$. For example, metals or semiconductors having the Ettingshausen effect, such as HgTe, HgSe, cadmium arsenide, $(Bi, Sb)_2(Se, Te)_3$, and $Bi_2(Se, Te)_3$, can be used.

In the above-mentioned examples, a Fe thin film is used as the magnetic thin film; however, the material for the magnetic thin film is not limited to Fe. Other materials which can generate a magnetic field upon being magnetized, such as 3 d transition metals (e.g., Cr, Mn, Co, and Ni, etc.) and alloys (e.g., Ni-Fe, Cu-Ni, and Pd-Ni, etc.) can be used.

The Ettingshausen element thin film and magnetic thin film used in the above-mentioned examples can be formed on a substrate by a conventionally used film-forming method such as a vacuum evaporation method, an atmospheric film-forming method, and a printing method.

In the above-mentioned examples, the Ettingshausen element is used as a thermoelectric element; however, the thermoelectric converter is not limited to the Ettingshausen element. Other kinds of thermoelectric elements can be used.

In the above-mentioned examples, the external frame and the internal frame have a cylindrical shape; however, these frames may have a square shape, a polygonal shape, an elliptical shape, and the like.

In the above-mentioned examples, a fan is used for allowing air to flow into a dehumidifier. Other kinds of instruments, which allow the air to flow into the dehumidifier and to flow out thereof, can be used.

In the above-mentioned examples, the fan is attached to one end of the external cylindrical frame or the internal cylindrical frame. The present invention is not limited to such a structure. More specifically, fans are attached to both ends of the external cylindrical frame or the internal cylindrical frame, whereby one of the fans is used for allowing the air to flow into the dehumidifier and the other of the fans is used for discharging the air therefrom. Moreover, a fan for allowing the air to flow into the dehumidifier can be attached in the vicinity of the inlet or internal inlet. Furthermore, the means for allowing the air to flow into the dehumidifier can be provided outside of the dehumidifier, as long as the means can allow the air to flow into the dehumidifier and to be discharged therefrom.

In the above-mentioned examples, a plate-shaped fin is used as the cooling fin and the heating fin; however, a wave-shaped or uneven fin can be used as the cooling fin and the heating fin.

In the above-mentioned examples, the inner surface of the internal cylindrical frame is used as a cooling surface, and the outer surface is used as a heating surface. The direction of an electric current flowing through the thermoelectric converter is made opposite or the direction of the magnetic lines of force caused by the magnetic thin film is made opposite, whereby the inner surface of the internal cylindrical frame is used as a heating surface and the outer surface thereof is used as a cooling surface.

The Ettingshausen element thin film and magnetic thin film can be formed on the inner surface of the internal cylindrical frame.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A dehumidifier comprising:
a first frame;
a second frame formed inside of the first frame, having a first opening and a second opening; and
means for allowing air to flow from the first opening to the second opening,
wherein the first frame encloses the second frame except for at least one of the first and the second opening and forms an outer air channel surrounding the second frame, the second frame has a hollow substrate so as to form an inner air channel, a thermoelectric element formed on a surface of the hollow substrate directly, a pair of electrodes connected to the thermoelectric element, for supplying an electric current to the thermoelectric element, and the thermoelectric element is made of an Ettingshausen element and causes a temperature difference between an outer surface and an inner surface of the hollow substrate of the second frame.

2. A dehumidifier according to claim 1, wherein the second frame has a plurality of magnetic thin films provided on the surface of the hollow substrate so that magnetic lines of force are formed in a direction substantially perpendicular to a direction of an electric current flowing through the Ettingshausen element.

3. A dehumidifier according to claim 2, wherein the Ettingshausen element is a ribbon-shaped Ettingshausen element, spirally provided on the surface of the hollow substrate and each of the magnetic thin films is disposed on the surface of the hollow substrate between adjacent Ettingshausen element.

4. A dehumidifier according to claim 3, wherein the width of the Ettingshausen element becomes progressively larger in a direction from the first opening to the second opening.

5. A dehumidifier according to claim 1, wherein the second frame is a cylindrical frame and an inner diameter of the second frame becomes progressively smaller in a direction from the first opening to the second opening.

6. A dehumidifier according to claim 1, wherein a fin for cooling air is provided inside of the second frame.

7. A dehumidifier according to claim 1, wherein a fin for releasing heat generated in the second frame is provided between the first frame and the second frame.

8. A dehumidifier for dehumidifying air by cooling the air by using a thermoelectric element, comprising a frame having a first opening and a second opening and means for allowing air to flow from the first opening to the second opening through the frame, wherein the frame includes;
- a hollow substrate,
- a thermoelectric element which is made of an Ettingshausen element directly formed on a surface of the hollow substrate,
- a pair of electrodes which is connected to the thermoelectric element, for supplying an electric current to the Ettingshausen element,
- a plurality of magnetic thin films provided on the surface of the hollow substrate so that magnetic lines of force are formed in a direction substantially perpendicular to a direction of an electric current flowing through the thermoelectric element,
- and wherein the thermoelectric element causes a temperature difference between an outer surface and an inner surface of the hollow substrate of the frame.

9. A dehumidifier according to claim 8, wherein the thermoelectric element is formed in a ribbon-shape and spirally provided on the surface of the hollow substrate, and each magnetic thin film is arranged between adjacent portions of the spiral of the thermoelectric element.

10. A dehumidifier according to claim 9, wherein the width of the thermoelectric element becomes progressively larger in a direction from the first opening to the second opening.

11. A dehumidifier according to claim 8, wherein the frame is a cylindrical frame and an inner diameter of the frame becomes progressively smaller in a direction from the first opening to the second opening.

12. A dehumidifier according to claim 8, wherein a fin for cooling air is provided inside of the frame.

13. A dehumidifier according to claim 8, wherein a fin for releasing heat generated in the frame is provided outside of the frame.

14. A method for dehumidifying air by using a dehumidifier comprising a frame having a first opening and a second opening, the frame including a hollow substrate; a thermoelectric element which is made of an Ettingshausen element directly formed on a surface of the hollow substrate; a pair of electrodes which is connected to the thermoelectric element; a plurality of magnetic thin films provided on the surface of the hollow substrate so that magnetic lines of force are formed in a direction substantially perpendicular to a direction of an electric current flowing through the thermoelectric element, the method including the steps of:
- supplying a predetermined electric current to the thermoelectric element via the pair of electrodes so as to cause a temperature difference between an outer surface and an inner surface of the frame,
- allowing air to flow from the first opening to the second opening through the frame so as to be dehumidified, and
- when the frame is frosted, supplying an electric current in an opposite direction of that of the predetermined current via the pair of electrodes.

* * * * *